US011413556B2

(12) United States Patent
Dinh et al.

(10) Patent No.: US 11,413,556 B2
(45) Date of Patent: Aug. 16, 2022

(54) REDUCING OR ELIMINATING LIQUID DE-GASSING (71) Applicant: TSI Incorporated, Shoreview, MN (US)

(72) Inventors: Martino Dinh, Shakopee, MN (US); Eric Ellsworth, Shoreview, MN (US)

(73) Assignee: TSI Incorporated, Shoreview, MN (US)

( * ) Notice: Subject to any disclaimer, the term of this patent is extended or adjusted under 35 U.S.C. 154(b) by 0 days.

(21) Appl. No.: 17/296,943

(22) PCT Filed: Nov. 27, 2019

(86) PCT No.: PCT/US2019/063601
§ 371 (c)(1),
(2) Date: May 25, 2021

(87) PCT Pub. No.: WO2020/112997
PCT Pub. Date: Jun. 4, 2020

(65) Prior Publication Data
US 2021/0354053 A1 Nov. 18, 2021

Related U.S. Application Data (60) Provisional application No. 62/772,830, filed on Nov. 29, 2018.

(51) Int. Cl.
*B01D 19/00* (2006.01)
(52) U.S. Cl.
CPC ..... *B01D 19/0063* (2013.01); *B01D 19/0047* (2013.01)
(58) Field of Classification Search
None
See application file for complete search history.

(56) References Cited

U.S. PATENT DOCUMENTS 4,927,433 A * 5/1990 Wieland ............. B01D 19/0005
95/12
5,266,481 A * 11/1993 Wegner ............. B01D 19/0047
435/246
(Continued)

FOREIGN PATENT DOCUMENTS

KR 970060362 A 8/1997
KR 20010110909 A 12/2001
(Continued)

OTHER PUBLICATIONS

"International Application Serial No. PCT/US2019/063601, International Search Report dated Mar. 18, 2020", 3 pgs.
(Continued)

*Primary Examiner* — Christopher P Jones
*Assistant Examiner* — Phillip Y Shao
(74) *Attorney, Agent, or Firm* — Schwegman Lundberg & Woessner, P.A.

(57) ABSTRACT

Various embodiments include an exemplary design of an apparatus and related process to reduce or eliminate de-gassing from a liquid precursor during dispensing of the liquid precursor under vacuum. In one embodiment, the apparatus includes a liquid-flow controller configured to be coupled to a liquid-supply vessel containing the liquid precursor, and at least one valve hydraulically coupled downstream of and to the liquid-flow controller by a liquid line. The at least one valve is to be opened and closed to maintain a minimum pressure that is sufficiently high enough to reduce or prevent degassing of the liquid precursor throughout the liquid line. An atomizer is hydraulically coupled downstream of and to the at least one valve. The atomizer can produce droplets of the liquid precursor and is further to be coupled on a downstream side to a vacuum source. Other methods and apparatuses are disclosed.

17 Claims, 5 Drawing Sheets

(56) References Cited

U.S. PATENT DOCUMENTS

| | | | |
|---|---|---|---|
| 6,312,816 B1* | 11/2001 | Roeder | C30B 29/32 |
| | | | 428/432 |
| 2001/0029090 A1* | 10/2001 | Kawahara | H01L 21/02271 |
| | | | 438/546 |
| 2006/0037539 A1 | 2/2006 | Toda et al. | |
| 2014/0034751 A1* | 2/2014 | Guillon | B01F 5/04 |
| | | | 239/74 |

FOREIGN PATENT DOCUMENTS

| | | |
|---|---|---|
| KR | 20020009215 A | 2/2002 |
| KR | 100805930 B1 | 2/2008 |
| WO | WO-2020112997 A1 | 6/2020 |

OTHER PUBLICATIONS

"International Application Serial No. PCT/US2019/063601, Written Opinion dated Mar. 18, 2020", 4 pgs.

"International Application Serial No. PCT US2019 063601, International Preliminary Report on Patentability dated Jun. 10, 2021", 6 pages.

"European Application Serial No. 4270.010EP1, Response to Communication pursuant to Rules 161(2) and 162 EPC filed Dec. 15, 2021", 10 pgs.

\* cited by examiner

REDUCING OR ELIMINATING LIQUID DE-GASSING

CLAIM OF PRIORITY

This application is a U.S. National-Phase Filing under 35 U.S.C. § 371 from International Application Number PCT/US2019/063601, filed 27 Nov. 2019, entitled, "REDUCING OR ELIMINATING LIQUID DE-GASSING," which claims the priority benefit to U.S. Patent Application Ser. No. 62/772,830, filed on 29 Nov. 2018, and entitled "REDUCING OR ELIMINATING LIQUID DE-GASSING," which are incorporated by reference herein in their entireties.

TECHNICAL FIELD

The subject matter disclosed herein relates to material deposition process equipment used in the semiconductor and allied industries. More specifically, the disclosed subject matter relates to reducing or eliminating de-gassing from a liquid precursor during dispensing under vacuum.

BACKGROUND

In one material deposition process, various types of thin films are deposited and patterned on a semiconductor substrate to form integrated circuits. Various processing methods include depositing a reactive precursor onto a substrate (e.g., a silicon wafer) in an atmospherically-controlled reactor. The reactive precursor typically must be converted from a solid or liquid state into a respective gaseous or vapor state to achieve increased uniformity by a vapor deposition process. The precursor vapor, once generated, is directed into the reaction chamber where the vapor subsequently deposits onto the substrate.

Various types of deposition processes are known in the art and include, for example, chemical vapor deposition (CVD) processes and atomic layer deposition (ALD) processes, among others. In a CVD process, a gaseous precursor is delivered into the reaction chamber and is deposited on a heated substrate. The precursor then dissociates in a chemical reaction to coat the substrate with a layer of deposited material. In an ALD process, a layer of a first precursor forms on a surface of the substrate and forms a monolayer of material. The first precursor is purged from the system and a second precursor is introduced into the reaction chamber to react with the layer created by the first precursor. The second precursor is then purged from the chamber. This process is repeated until a layer of the desired thickness and composition is formed on the substrate.

Many of the gaseous precursors that are deposited start as liquid precursors (e.g., tetramethylsilane ($Si(CH_3)_4$), hexachlorodisilane ($Cl_6Si_2$), hafnium tetrachloride ($HfCl_4$), and numerous other precursor types known in the art). As described in more detail below, the liquid precursors are atomized into fine droplets, and then heated to produce the vapors used in the various processes. Liquid precursor vaporization techniques are frequently used for CVD and ALD techniques.

However, a well-known gas law, Henry's Law, states that, at a constant temperature, the amount of a given gas dissolved in a given type and volume of liquid is proportional to its partial pressure in the gas phase. Therefore, at lower pressures, gases dissolved into a liquid (e.g., a liquid precursor) will be released—thus, de-gassing occurs and bubbles are formed. An apparatus and method for eliminating or reducing liquid de-gassing during dispensing under vacuum is disclosed herein.

The information described in this section is provided to offer the skilled artisan a context for the following disclosed subject matter and should not be considered as admitted prior art.

DETAILED DESCRIPTION

The description that follows includes illustrative examples, devices, and apparatuses that embody the disclosed subject matter. In the following description, for purposes of explanation, numerous specific details are set forth in order to provide an understanding of various embodiments of the inventive subject matter. It will be evident, however, to those of ordinary skill in the art that various embodiments of the inventive subject matter may be practiced without these specific details. Further, well-known structures, materials, and techniques have not been shown in detail, so as not to obscure the various illustrated embodiments.

As used herein, the term "or" may be construed in an inclusive or exclusive sense. Additionally, although various exemplary embodiments discussed below focus on particular techniques to reduce or eliminate de-gassing from a liquid precursor, none of these techniques needs to be applied to reducing or eliminating particle counts as a single technique. Upon reading and understanding the disclosure provided herein, a person of ordinary skill in the art will readily understand that various combinations of the techniques and examples may all be applied serially or in various combinations. As an introduction to the subject, a few embodiments will be described briefly and generally in the following paragraphs, and then a more detailed description, with reference to the figures, will ensue.

In the following detailed description, reference is made to the accompanying drawings that form a part of the system and process to reduce or eliminate de-gassing from liquid precursors during dispensing under vacuum, by way of illustration and specific embodiments. Other embodiments may be utilized and, for example, various thermodynamic, electrical, or physical changes may be made without departing from the scope of the present disclosure. The following detailed description is, therefore, is to be taken in an illustrative sense rather than in a limiting sense.

Figure 1:
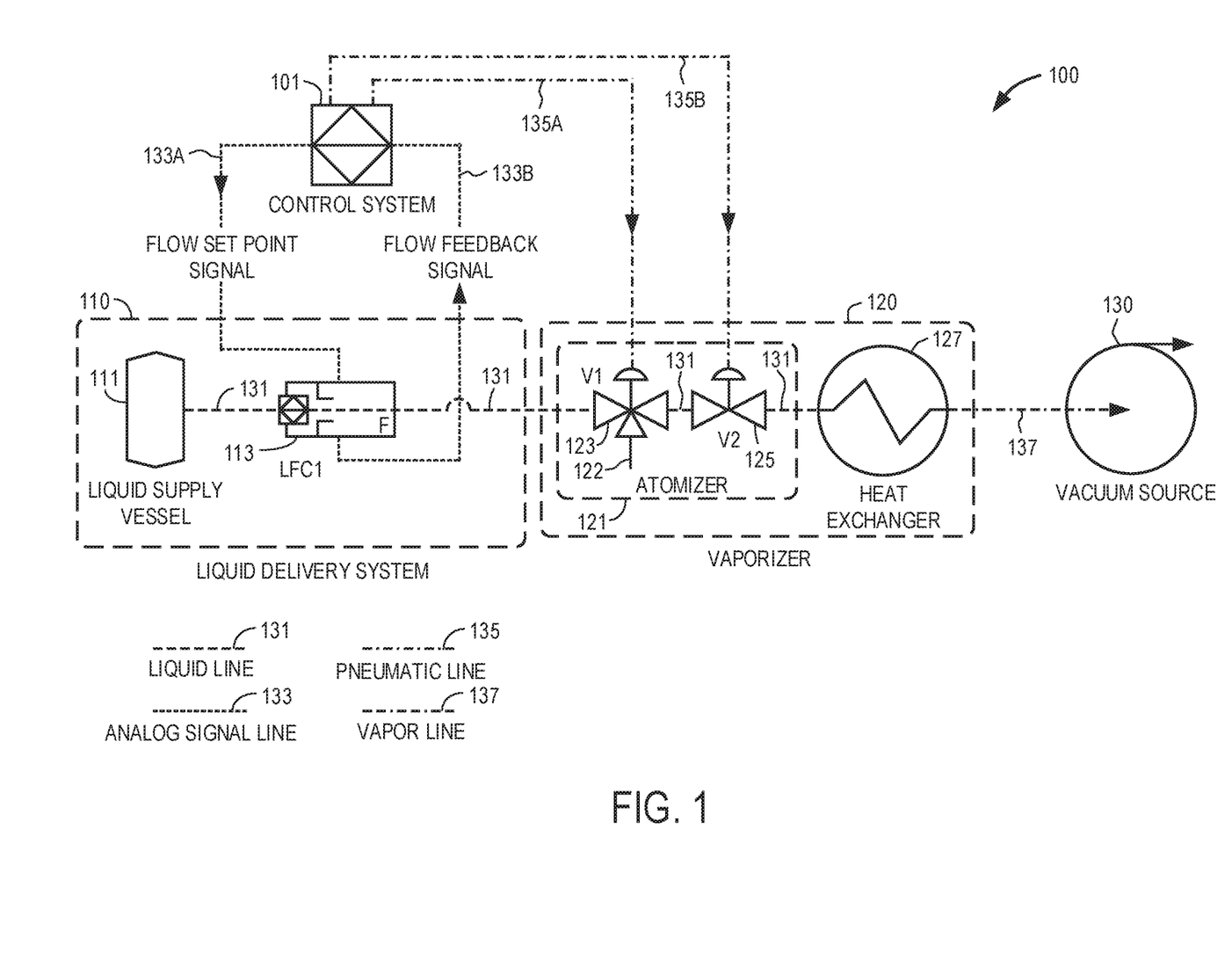
FIG. 1 shows a schematic diagram of an exemplary embodiment of a system to reduce or eliminate liquid de-gassing during dispensing under vacuum, when using liquid precursors.

FIG. 1 shows a schematic diagram of an exemplary embodiment of a system 100 to reduce or eliminate de-gassing from liquid precursors during dispensing under vacuum. The system 100 is shown to include a liquid delivery system 110, a vaporizer 120, and a vacuum source 130. A person of skill in the art will recognize that, in the case of forming films on, for example, a semiconductor substrate, a deposition chamber (not shown) may be placed between the vaporizer 120 and the vacuum source 130 (e.g., a vacuum pump, such as a turbomolecular pump). Also, in various embodiments, a separate carrier gas line (not shown) may convey a carrier gas (a "push gas," e.g., argon, nitrogen, or other inert gas) to be used in transporting the vapor produced from the liquid precursor into the deposition chamber.

The schematic diagram of the system 100 also indicates a liquid line 131 (e.g., for delivery of liquid precursors), analog-signal lines 133, pneumatic lines 135, and vapor line 137. A person of ordinary skill in the art, upon reading and understanding the disclosure provided herein, will recognize that the analog-signal lines 133 can also incorporate digital-signal lines in addition to or instead of the analog-signal lines 133. Also, digital signals may be transmitted over the analog-signal lines 133. The analog-signal lines 133 are therefore shown and described merely for convenience in describing various aspects of the disclosed subject matter.

A control system 101 can send a flow set-point signal via signal line 133A to a liquid-flow controller 113 and receive a flow-feedback signal from the liquid-flow controller 113 via feedback-signal line 133B.

The liquid-flow controller 113 is arranged to receive a liquid (e.g., a liquid precursor) from a liquid-supply vessel 111. As described in more detail below, the liquid-flow controller 113 is controlled by the control system 101 for an amount of liquid from the liquid-supply vessel 111 that is allowed to pass onto the vaporizer 120.

In various embodiments, the liquid-flow controller 113 is a mass-flow controller. Consequently, flow is controlled in units of mass per unit of time (e.g., grams per minute (gpm)). The control system 101 can include a programmable logic controller (PLC), a proportional-integral-derivative (PID) controller, a distributed control system (DCS), a system-logic controller (SLC), or other type of controller known in the art. One type of liquid-flow controller suitable for the operations described herein is, for example, an MSP 2910 Multi-Function Controller (available from MSP Corporation, Shoreview, Minn., USA). The MSP 2910 controller has three PID control loops with a dedicated PID loop for piezo-valve control and liquid flow control.

The vaporizer 120 includes a first valve 123 and a second valve 125 within an atomizer 121. As is known to a skilled artisan, the atomizer 121 is used to generate an extremely-fine mist comprising liquid droplets. The liquid droplets are then vaporized downstream of the atomizer 121 in a heat exchanger 127. The heat exchanger 127 changes the liquid droplets into a vapor. In various embodiments, the heat exchanger 127 may comprise a clam-shell heater, a radiant heater, a resistive-element heater, or various type of other internally-mounted or externally-mounted heaters known in the art.

In various embodiments, each of the first valve 123 and the second valve 125 may comprise various types of valves known in the art including, for example, ball valves, one of various types of throttling valves (e.g., a ball valve, gate valve, butterfly valve, or other control valve), piezo valves, or other types of liquid valves known in the art. The valves may be manually controlled or controllable automatically (e.g., pneumatically controlled, electrically controlled, or hydraulically controlled). As shown in the example of FIG. 1, the first valve 123 and the second valve 125 are controlled by a first pneumatic line 135A and a second pneumatic line 135B, respectively. In various embodiments, the first valve 123 may optionally be arranged as a three-way valve to function as a purge-control valve for the atomizer 121. A drain line 122 coming from the first valve 123 allows purged fluids to be directed outside of the atomizer 121. In other embodiments, the first valve 123 may be a two-way valve.

In various embodiments, the first valve 123 and the second valve 125 may be arranged to reduce or eliminate the formation of bubbles from forming in various portions of the liquid line 131 in the system 100. The bubbles are caused by liquid de-gassing as described in more detail below with reference to FIGS. 2 through 3C.

For example, when the vacuum source 130 is operational, a low pressure is created in the vapor line 137, the heat exchanger 127, and the portion of the liquid line 131 downstream of the second valve 125. The low pressure may be at, for example, about 267 Pascal (Pa) (approximately 2 Torr or about 0.04 psia). In comparison, while at least the first valve 123 is still closed, a pressure in the portion of the liquid line 131 downstream of the liquid-flow controller 113 and upstream of the first valve 123 may be about, for example, about 345 kPa (approximately 2586 Torr or approximately 50 psia). (Note that a length of the portion of the liquid line downstream of the liquid-flow controller 113 and upstream of the first valve 123 is typically much longer than the portion of the liquid line 131 between the first valve 123 and the second valve, thereby allowing a potentially much greater formation of bubbles in the longer line.) However, once the second valve 125 is opened, a portion of the liquid line 131 that is located between the first valve 123 and the second valve 125 is exposed to the low pressure created by the vacuum source 130. Consequently, the portion of the line 131 between the first valve 123 and the second valve 125 is now at approximately 267 Pa. As a result, as soon as the first valve 123 is opened, the entire portion of the liquid line 131 that is upstream of the first valve 123 is reduced very quickly to a pressure of approximately 267 Pa as well. At this low pressure, and as described in more detail below, bubbles may begin forming within the liquid line 131 quickly. Therefore, by opening the first valve 123 while the second valve 125 is still closed, the portion of the liquid line upstream of the first valve 123 remains at the higher pressure (e.g., 2586 kPa) and bubbles will not form. The second valve 125 can then be opened (for example, at approximately the same time as the liquid-flow controller 113), and later closed as needed to reduce or eliminate the formation of bubbles in any portion of the liquid line 131. Opening and closing of the first valve 123 and the second valve 125 are described in more detail below.

In other embodiments, the atomizer 121 may have only a single valve (e.g., the second valve 125). Preventing or reducing the formation of bubbles in the liquid line 131 is then controlled solely by the second valve 125.

Figure 2:
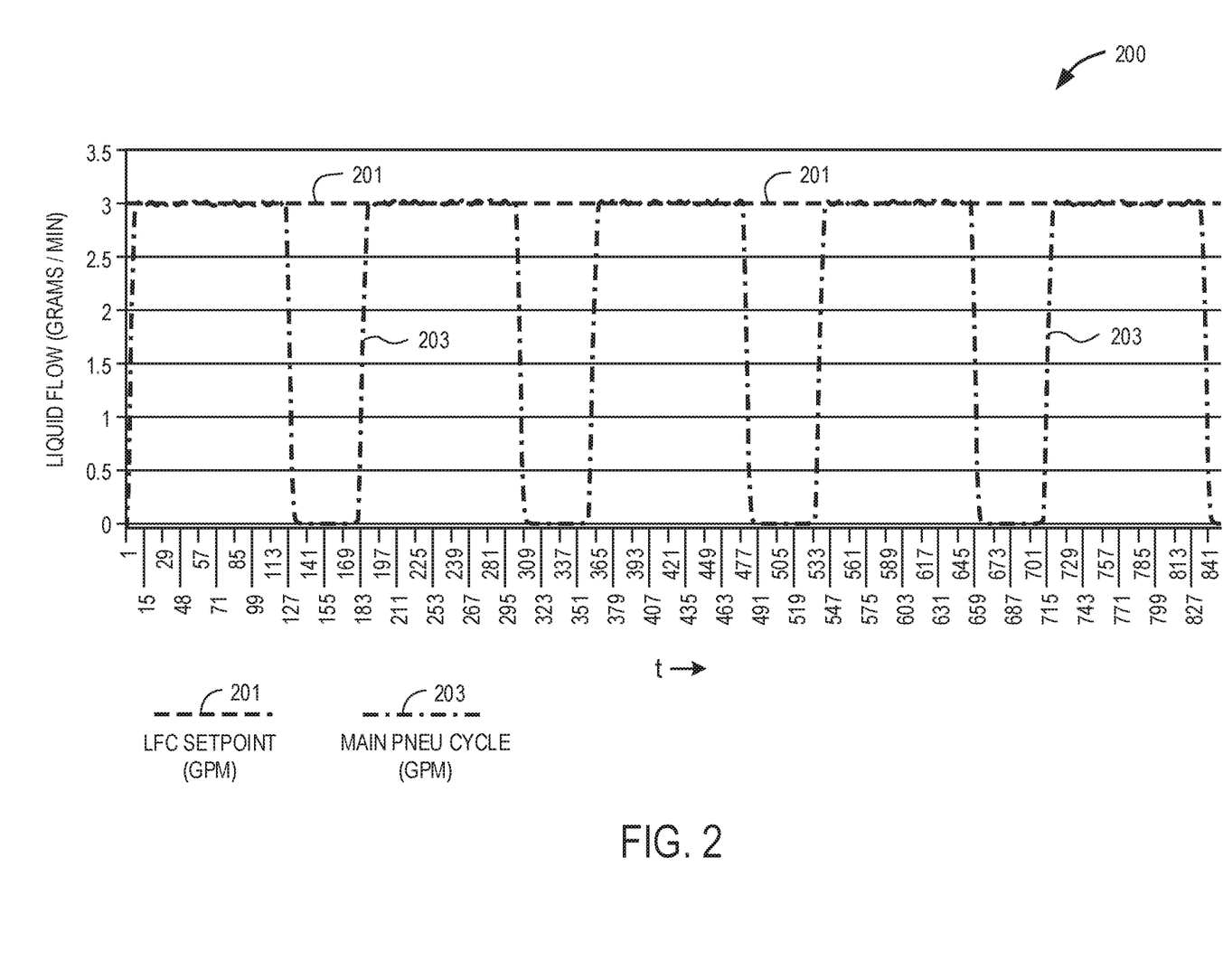
FIG. 2 shows a graph of high-level exemplary embodiment of a process to reduce or eliminate liquid de-gassing during dispensing under vacuum, when using liquid precursors.

With reference now to FIG. 2, a graph 200 of a high-level exemplary embodiment of a process to reduce or eliminate liquid de-gassing during dispensing under vacuum, when using liquid precursors, is shown. The graph 200 provides an overview only, and therefore omits some technical details.

However, the graph 200 provides a simplified explanation of the more detailed graphs of FIGS. 3A through 3C as shown and described below.

Consequently, a pressure of the liquid flow, if too low, causes dissolved gas to come out of the solution, thereby forming gas bubbles prior to (upstream) the atomizer 121 (see FIG. 1). The gas bubbles can prevent a stable deposition on, for example, a semiconductor substrate. Therefore, various embodiments of the disclosed subject matter maintain a minimum pressure (but high enough to reduce or prevent de-gassing) throughout the liquid line 131 (FIG. 1) by periodically closing downstream valves. Since the pressure in the line is substantially above a pressure that would allow de-gassing from the liquid, regardless of downstream (downstream of the liquid-flow controller 113) perturbations in the system, any liquid de-gassing is reduced or eliminated.

For example, the graph 200 indicates that alternating at least one of the valves (e.g., the first valve 123 and the second valve 125 of FIG. 1) between an opened position and a closed position can reduce or eliminate de-gassing of the liquid precursor in the liquid line 131. If the valve is fully opened at all times, the liquid precursor is exposed to a vacuum condition from the vacuum source 130. Therefore, in accordance with Henry's Law discussed above, the liquid will begin to de-gas due to the lowered-pressure conditions in the liquid line 131. By closing the valve (e.g., the first valve 123) downstream of the liquid-flow controller 113 in an opened state, the pressure within the liquid line 131 again increases. Once the pressure has increased, the valve may again be opened allowing the liquid precursor to continue from the liquid-flow controller 113, to the atomizer 121, and on to the heat exchanger 127. Pressure is maintained at a level sufficient to reduce or eliminate dissolved gases from coming out of the liquid precursor. Therefore, de-gassing from the liquid, and a concomitant formation of gas bubbles in the liquid line 131, is either reduced from prior art systems or the de-gassing and related gas bubbles are eliminated. The pressure needed to obtain this result is either known in the art or is calculable from well-known governing equations (e.g., such as Henry's Law) for a given liquid, set of process conditions, and other factors.

The graph 200 indicates liquid flow (e.g., of a liquid precursor) as a function of time (arbitrary units). As indicated by the graph 200, the liquid-flow controller (LFC) set-point 201 is maintained at approximately 3 grams per minute (gpm) while a valve downstream of the LFC is manually opened and closed at periodic intervals, thereby causing the actual flow to alternate between 0 gpm and 3 gpm. Consequently, when the valve is fully (or substantially-fully opened), the liquid flow-rate matches the set-point of the LFC at approximately 3 gpm. When the valve is fully closed, the liquid flow-rate drops to 0 gpm.

During a first period of time (e.g., between approximately 1 and 127 time units) when the valve is opened, the liquid flows through the liquid line 131 (FIG. 1), but the pressure will begin to drop. The pressure naturally decreases in any line. However, the liquid line 131 is in upstream communication with the vacuum source 130. Consequently, during a second period of time when the valve is closed (e.g., between approximately 130 and 180 time units), the pressure of the liquid in the line again increases, thereby reducing or eliminating de-gassing from the liquid line 131. The process is described in more detail below with reference to FIGS. 3A through 3C.

Figure 3A:
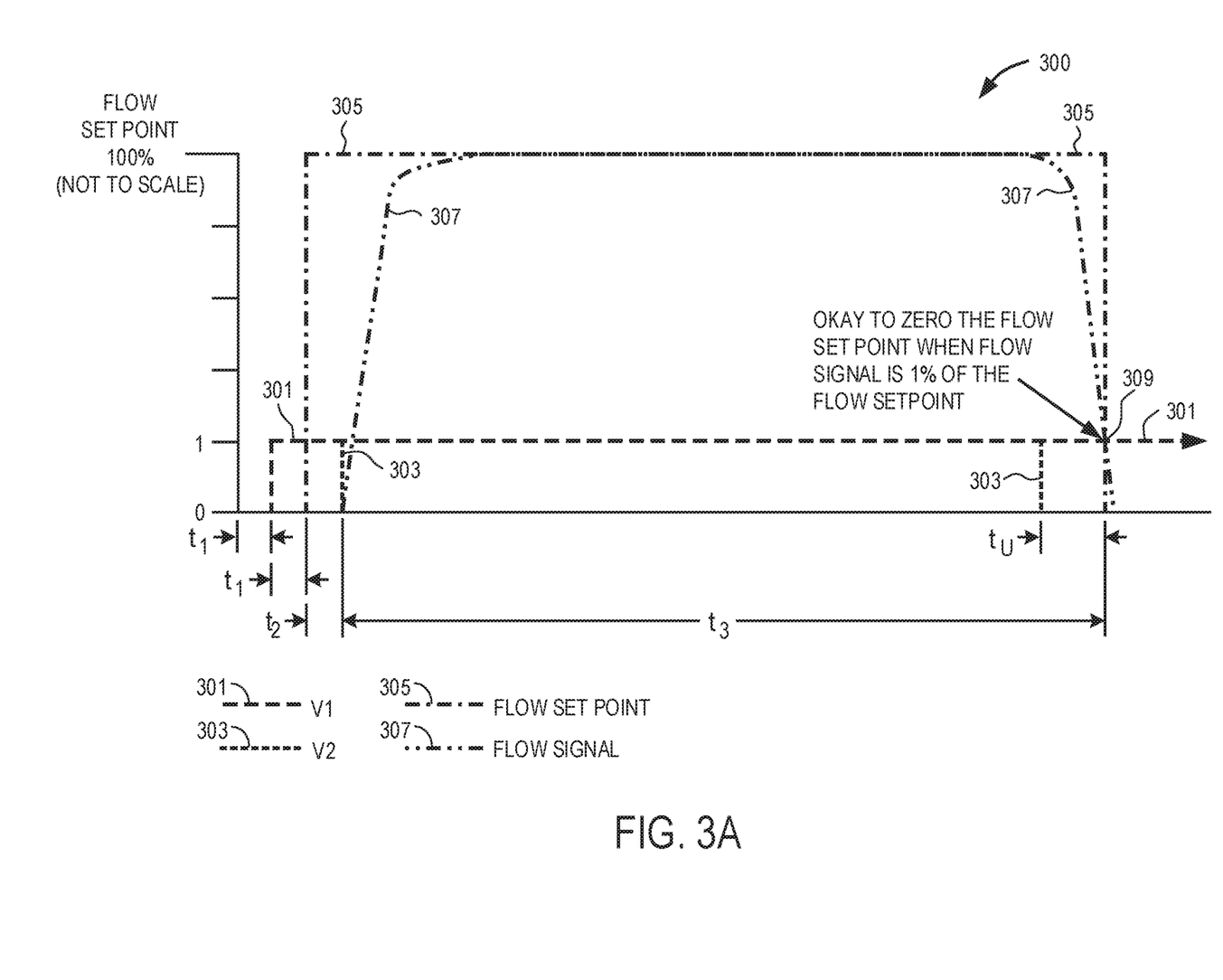
FIG. 3A shows an embodiment of a process timeline where an analog set-point signal is zeroed for each vapor pulse in a single-pulse diagram, in accordance with the exemplary embodiment of the system of FIG. 1.

FIG. 3A shows an embodiment of a process timeline where an analog set-point signal is "zeroed" (thereby closing the liquid-flow controller 113 of FIG. 1) for each vapor pulse in a single-pulse diagram 300, in accordance with the exemplary embodiment of the system of FIG. 1. The single-pulse diagram 300 shows only a single vapor-pulse to simplify an explanation of the disclosed subject matter. However, the description of the single-pulse diagram 300 is readily applicable to the process timelines of FIGS. 3B and 3C as well, which are described below.

With concurrent reference to FIG. 1, the single-pulse diagram 300 indicates a first valve-signal 301, for valve "V1" (e.g., the first valve 123 in the atomizer 121 of FIG. 1), a second valve-signal 303, for valve "V2" (e.g., the second valve 125 of FIG. 1), a flow set-point signal 305 (e.g., the signal line 133A to the liquid-flow controller 113 of FIG. 1), and a flow signal 307 (e.g., the flow-feedback signal on the feedback-signal line 133B of FIG. 1). As noted above with reference to FIG. 1, only one of the two valves indicated by the signals of FIG. 3A is sufficient for the process described herein.

The single-pulse diagram 300 indicates that both valves V1 and V2 are initially closed. Therefore, no liquid flows through the atomizer 121 to the heat exchanger 127. At time $t_1$, the first valve V1 receives the first valve-signal 301 and is turned on (opened). After a second period of time $t_1$, a flow set-point signal 305 opens the liquid-flow controller 113 to a predetermined level (e.g., for a given process). After a third time-period $t_3$, the second valve V1 receives the second valve-signal 303 and is turned on (opened). The flow signal 307 indicates that liquid begins flowing shortly after the second valve V2 is opened and eventually reaches a mass flow-rate as set by the liquid-flow controller 113.

The process continues until a predetermined amount of time has passed. The predetermined amount of time can be determined by a person of ordinary skill in the art upon reading and understanding the disclosure provided herein, combined with desired process characteristics (e.g., a thickness of film deposited on a substrate for a given liquid precursor, a viscosity of the fluid at the operating temperature, and other factors known to the skilled artisan). In this embodiment, after the first valve V1 receives the first valve-signal 301 and is turned on (opened), the first valve remains open. However, in other embodiments, the first valve may be closed (receive a signal "0") proximate in time to when the second valve is closed. In these embodiments, the terms "proximate in time" are system and process dependent so may vary from within a few milliseconds to several seconds or more.

The units of time shown on the graph are given so as to explain an exemplary process and should not be considered to be fixed or even proportional to each other. For example, $t_1$ is an arbitrary period of time. In some embodiments, the valve V1 may be opened prior to the flow set-point signal being sent to the liquid-flow controller 113 (FIG. 1). In some embodiments, the valve V1 may be opened simultaneously with or approximately simultaneously with the flow set-point signal being sent to the liquid-flow controller 113. In some embodiments, the valve V1 may be opened subsequent to the flow set-point signal being sent to the liquid-flow controller 113. As shown in FIG. 3A, in some embodiments, the first time-period $t_1$ may be the same as or similar to the second time-period $t_1$. In some embodiments, the first time-period $t_1$ may be the same as or greater than the second time-period $t_1$. In some embodiments, the first time-period $t_1$ may be the same as or less than the second time-period $t_1$.

The time period $t_2$ can be dependent on a number of factors including, for example, fluid (e.g., liquid) system-pressure, fluid viscosity, and other factors that may be determined by a skilled artisan. The time period $t_3$ is a time period that is process specific and is related to a length of time that is applicable to a given process (e.g., an amount of time for a given thickness of deposition on a substrate). The time period $t_u$ is unknown but, as with the other time periods described herein, may be determined empirically and is dependent on fluid factors such as pressure and viscosity of the fluid (e.g., liquid) and can also include mechanical factors of the system such as residence time in tubing (e.g., a length of the liquid line 131), etc.

In a specific exemplary embodiment, the time period $t_u$ may be set to be approximately equal to a period of time when the flow set-point is set to "0" at approximately 1% of the flow set-point as indicated by an intersection point 309 of FIG. 3A. In general, there is sufficient pressure in liquid delivery lines (e.g., the liquid line 131 of FIG. 1) so that the flow set-point can be set to "0" without a risk of creating bubbles within the liquid delivery lines between the liquid-flow controller 113 and, for example, the first valve 123.

Therefore, in some embodiments, the intersection point 309 may be set to higher of lower levels of the flow set-point. For example, in various embodiments, the time period $t_u$ may be set to be approximately equal to a period of time when the flow set-point is set to "0" at approximately 10% of the flow set-point. In other embodiments, the time period $t_u$ may be set to be approximately equal to a period of time when the flow set-point is set to "0" (the flow set-point is "zeroed") at approximately 0.1% of the flow set-point. Based on upon reading and understanding the disclosure provided herein, a person of ordinary skill in the art will recognize how to determine the time period $t_u$ and when the flow set-point is set to "0" for a given process tool and process conditions.

Figure 3B:
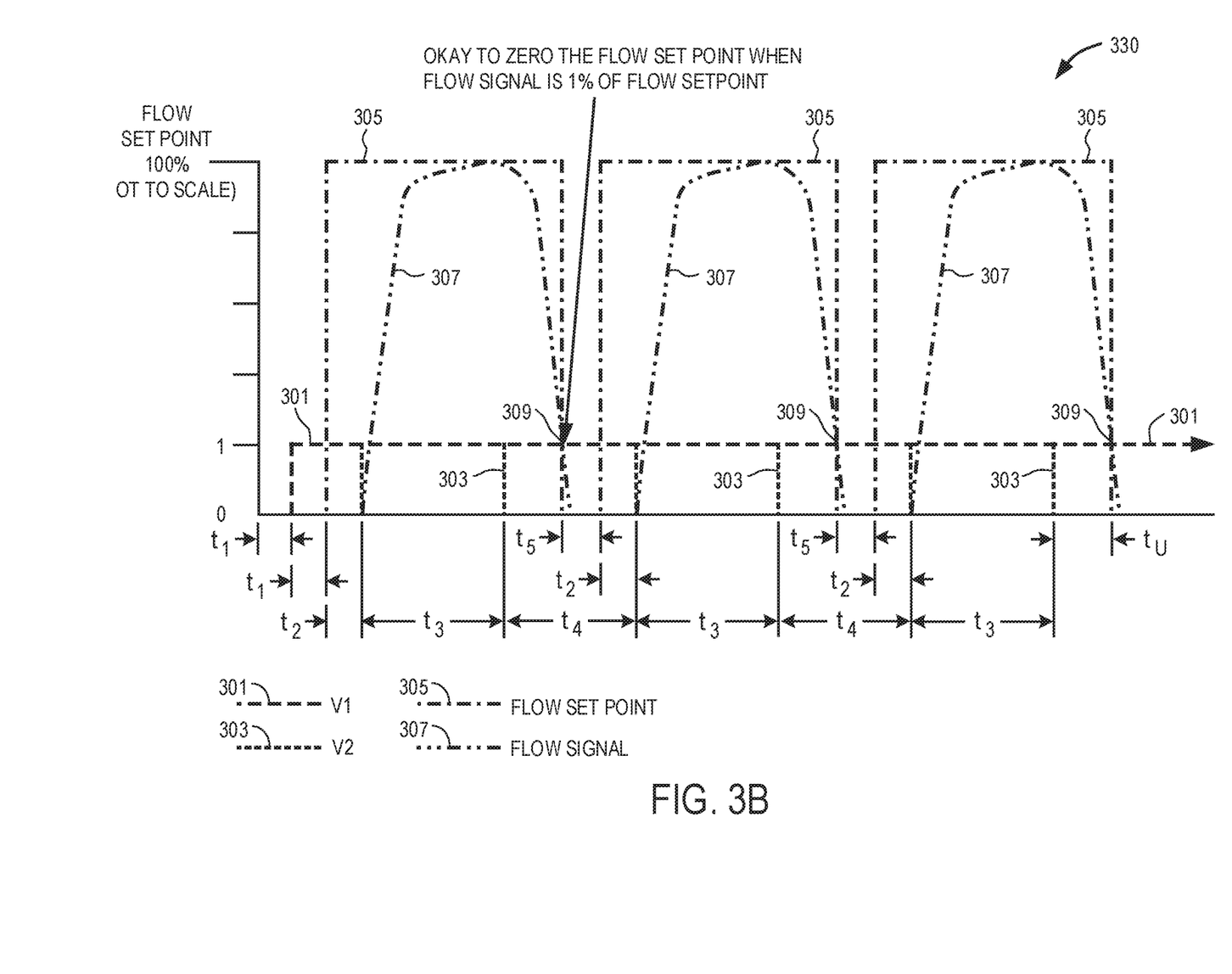
FIG. 3B shows an embodiment of a process timeline where an analog set-point signal is zeroed for each vapor pulse in a multiple-pulse, constant set-point diagram, in accordance with the exemplary embodiment of the system of FIG. 1.

Referring now to FIG. 3B, an embodiment of a process timeline where an analog set-point signal is zeroed for each vapor pulse in a multiple-pulse diagram 330 is shown, in accordance with the exemplary embodiment of the system of FIG. 1. The multiple-pulse diagram 330 is similar to the single-pulse diagram 300 of FIG. 3A except for a few condition differences. In the multiple-pulse diagram 330 of FIG. 3B, the flow set-point signal 305 is "zeroed" after each of a series of vapor pulses. Also, the multiple-pulse diagram 330 may include additional time periods. For example, time period tat represents a dwell time as may be considered for a given process and is therefore, process and process tool specific. Also, a time period $t_5$ can be considered as a difference between the time period $t_4$ and the time period $t_2$.

Further, a person of ordinary skill in the art, upon reading and understanding the disclosure provided herein, will recognize that each of the time periods shown may vary from one of the flow set-point signals 305 to the subsequent pulse. For example, each of the flow set-point signals 305 may be used for a different liquid precursor material, as might be used for an ALD process. In this case, the time period $t_3$ of a first of the flow set-point signals 305 may be different from the time period $t_3$ of a second of the flow set-point signals 305. However, based on the description provided herein, the skilled artisan will recognize how each of the time periods may be determined for a given process.

Figure 3C:
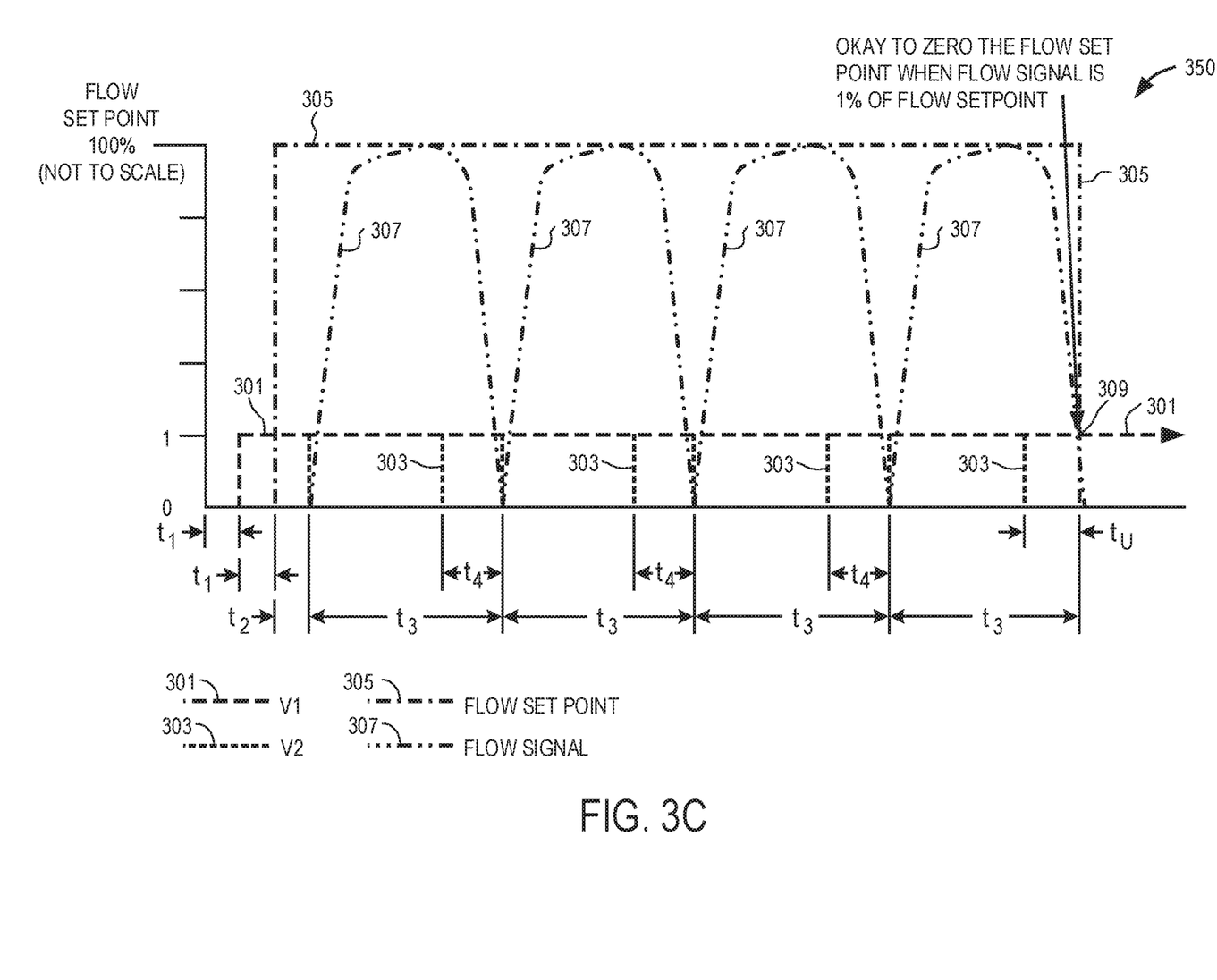
FIG. 3C shows an embodiment of a process timeline where an analog set-point signal is constant for each vapor pulse in a multiple-pulse diagram, in accordance with the exemplary embodiment of the system of FIG. 1.

FIG. 3C shows an embodiment of a process timeline where an analog set-point signal is constant for each vapor pulse in a multiple-pulse, constant set-point diagram 350, in accordance with the exemplary embodiment of the system of FIG. 1. The multiple-pulse, constant set-point diagram 350 is similar to the multiple-pulse diagram 330 of FIG. 3B. However, in FIG. 3C, the flow set-point signal 305 sends a signal to the liquid-flow controller 113 (FIG. 1) and the LFC remains open for the entire processing time (in the embodiment shown in FIG. 3C, there are four pulses). Therefore, the actual liquid flow is controlled by the second valve, V2, being opened and closed. Thus, the second valve controls the flow of liquid exclusively since the first valve V1 and the LFC, after being initially opened, remain constantly open throughout the process shown.

Therefore, the subject matter described above discloses how to maintain a pressure in a liquid line (e.g., carrying a liquid precursor) at a level sufficient to reduce or eliminate dissolved gases from coming out of the liquid precursor. Therefore, de-gassing from the liquid, and a concomitant formation of gas bubbles in the liquid line, is either reduced from prior art systems or the de-gassing and related gas bubbles are eliminated.

Although specific values, ranges of values, and techniques are given various parameters discussed above, these values and techniques are provided merely to aid the person of ordinary skill in the art in understanding certain characteristics of the designs and processes disclosed herein. Those of ordinary skill in the art will realize, upon reading and understanding the disclosure provided herein, that these values and techniques are presented as examples only and numerous other values, ranges of values, techniques, and hardware (including working fluids) may be employed while still benefiting from the novel designs discussed herein that may be employed in a system and process to reduce or eliminate de-gassing from a liquid line. Therefore, the various illustrations of the apparatus are intended to provide a general understanding of the structure and design of various embodiments and are not intended to provide a complete description of all the elements and features of the apparatus that might make use of the structures, features, and designs described herein.

Many modifications and variations can be made, as will be apparent to a person of ordinary skill in the art upon reading and understanding the disclosure provided herein. Functionally equivalent methods and devices within the scope of the disclosure, in addition to those enumerated herein, will be apparent to a person of ordinary skill in the art from the foregoing descriptions. Portions and features of some embodiments may be included in, or substituted for, those of others. Many other embodiments will be apparent to those of ordinary skill in the art upon reading and understanding the description provided herein. Such modifications and variations are intended to fall within a scope of the appended claims. The present disclosure is to be limited only by the terms of the appended claims, along with the full scope of equivalents to which such claims are entitled. It is also to be understood that the terminology used herein is for the purpose of describing particular embodiments only and is not intended to be limiting.

The Abstract of the Disclosure is provided to allow the reader to quickly ascertain the nature of the technical disclosure. The abstract is submitted with the understanding that it will not be used to interpret or limit the claims. In addition, in the foregoing Detailed Description, it may be seen that various features may be grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. An apparatus to reduce de-gassing from a liquid precursor during dispensing under vacuum, the apparatus comprising:

a liquid-flow controller configured to be coupled to a liquid-supply vessel containing the liquid precursor;

at least one valve hydraulically coupled downstream of and to the liquid-flow controller by a liquid line, the at least one valve configured to be opened and closed to maintain a minimum pressure that is sufficiently high enough to reduce de-gassing of the liquid precursor throughout the liquid line;

an atomizer hydraulically coupled downstream of and to the at least one valve, the atomizer configured to produce droplets of the liquid precursor and further to be coupled on a downstream side to a vacuum source; and a carrier gas line to convey a push gas to transport vapor produced by a heat exchanger from the droplets of the liquid precursor into a deposition chamber to be coupled between the atomizer and the vacuum source.

2. The apparatus of claim 1, wherein the heat exchanger is hydraulically coupled downstream of the atomizer to vaporize the droplets of the liquid precursor, thereby forming the vapor.

3. The apparatus of claim 1, wherein the deposition chamber is configured to form films from the droplets of the liquid precursor onto a substrate in the deposition chamber.

4. The apparatus of claim 1, liquid-flow controller coupled hydraulically between the liquid-supply vessel and the at least one valve, the liquid-flow controller configured to receive liquid from the liquid-supply vessel and control an amount of liquid from the liquid-supply vessel that is allowed to pass onto the at least one valve.

5. The apparatus of claim 4, wherein the liquid-flow controller is a mass-flow controller.

6. The apparatus of claim 4, control system coupled to the liquid-flow controller and the at least one valve, the control system being configured to:
provide a flow set-point signal to the liquid-flow controller and receive a flow-feedback signal from the liquid-flow controller; and
open and close the at least one valve to decrease and increase a pressure level, respectively, within the liquid line.

7. The apparatus of claim 6, wherein the control system includes at least one controller selected from controllers including a programmable logic controller (PLC), a proportional-integral-derivative (PID) controller, a distributed control system (DCS), and a system-logic controller (SLC).

8. The apparatus of claim 1, second valve hydraulically coupled between the at least one valve and the atomizer, the second valve to decrease and increase a pressure level within the liquid line.

9. The apparatus of claim 8, wherein the at least one valve and the second valve are configured to alternately be opened and closed to reduce the de-gassing of the liquid precursor in the liquid line.

10. The apparatus of claim 1, wherein the at least one valve comprises a three-way valve to function as a purge-control valve for the atomizer, wherein a drain line coupled to the at least one valve is configured to purge liquids from the apparatus.

11. An apparatus to reduce de-gassing from a liquid precursor, the apparatus comprising:

a first valve hydraulically coupled downstream of and to a liquid-flow controller by a liquid line, the liquid-flow controller coupled to a liquid supply vessel containing the liquid precursor, the first valve configured to maintain a pressure that is sufficiently high enough to reduce de-gassing of the liquid precursor throughout the liquid line;

an atomizer hydraulically coupled downstream of and to the first valve, the atomizer configured to produce droplets of the liquid precursor and further to be coupled on a downstream side to a vacuum source; and a second valve hydraulically coupled between the first valve and the atomizer, the second valve to decrease and increase a pressure level within the liquid line, the first valve and the second valve being configured to alternately be opened and closed to reduce the de-gassing of the liquid precursor in the liquid line.

12. The apparatus of claim 11, heat exchanger hydraulically coupled downstream of the atomizer to vaporize the droplets of the liquid precursor.

13. The apparatus of claim 12, deposition chamber coupled between the atomizer and the vacuum source, the deposition chamber configured to form films from the droplets of the liquid precursor onto a substrate in the deposition chamber.

14. The apparatus of claim 11, control system coupled to the first valve, the control system being configured to open and close the first valve to decrease and increase a pressure level, respectively, within the liquid line.

15. An apparatus to reduce de-gassing from a liquid precursor, the apparatus comprising:

a first valve and a second valve hydraulically coupled to each other in series and further hydraulically coupled downstream of and to a liquid-flow controller by a liquid line, the liquid-flow controller coupled to a liquid supply vessel containing the liquid precursor, the first valve and the second valve configured to maintain a pressure that is sufficiently high enough to reduce de-gassing of the liquid precursor throughout the liquid line, the first valve and the second valve further being configured to alternately be opened and closed to reduce the de-gassing of the liquid precursor in the liquid line; and an atomizer hydraulically coupled downstream of and to the first valve, the atomizer configured to produce droplets of the liquid precursor and further to be coupled on a downstream side to a vacuum source.

16. The apparatus of claim 15, heat exchanger hydraulically coupled downstream of the atomizer to vaporize the droplets of the liquid precursor.

17. The apparatus of claim 15, control system coupled to the first valve and to the second valve, the control system being configured to open and close the first valve and the second to decrease and increase a pressure level, respectively, within the liquid line.

* * * * *